US009568317B2

United States Patent
Croker et al.

(10) Patent No.: US 9,568,317 B2
(45) Date of Patent: Feb. 14, 2017

(54) FIBER OPTIC GYROSCOPE MIXED SIGNAL APPLICATION SPECIFIC INTEGRATED CIRCUIT

(71) Applicant: Honeywell International Inc., Morristown, NJ (US)

(72) Inventors: Chuck Croker, Glendale, AZ (US); Gregory W Keith, Glendale, AZ (US); Norman Gerard Tarleton, Glendale, AZ (US)

(73) Assignee: Honeywell International Inc., Morris Plains, NJ (US)

( * ) Notice: Subject to any disclaimer, the term of this patent is extended or adjusted under 35 U.S.C. 154(b) by 188 days.

(21) Appl. No.: 13/755,139

(22) Filed: Jan. 31, 2013

(65) Prior Publication Data

US 2014/0211210 A1 Jul. 31, 2014

(51) Int. Cl.
*G01C 19/66* (2006.01)
*G01C 19/72* (2006.01)
*G06F 17/50* (2006.01)

(52) U.S. Cl.
CPC .......... *G01C 19/662* (2013.01); *G01C 19/721* (2013.01); *G06F 17/5045* (2013.01)

(58) Field of Classification Search
CPC .................................................. G01C 19/662
USPC ....................................................... 356/326
See application file for complete search history.

(56) References Cited

U.S. PATENT DOCUMENTS 5,189,488 A * 2/1993 Mark et al. .................. 356/462
6,891,239 B2 5/2005 Anderson et al.
7,872,758 B2 1/2011 Ward et al.
8,294,900 B2 10/2012 Strandjord et al.
2004/0086008 A1 5/2004 Gregory et al.
2005/0003785 A1 * 1/2005 Jackson et al. .............. 455/260

(Continued)

FOREIGN PATENT DOCUMENTS

EP 2236983 6/2010
EP 2351984 3/2011

(Continued)

OTHER PUBLICATIONS

"SD721—Fail-Safe Single Axis Gyroscope Product Datasheet", "SensorDynamics AG", Sep. 2, 2011, pp. 1-33.

(Continued)

*Primary Examiner* — Tarifur Chowdhury
*Assistant Examiner* — Omar Nixon
(74) *Attorney, Agent, or Firm* — Fogg and Powers LLC

(57) ABSTRACT

A system comprising a fiber optic gyroscope and a mixed signal application specific integrated circuit (ASIC) connected to the gyroscope is provided. The mixed signal ASIC comprises a digital logic unit, a relative intensity noise (RIN) analog-to-digital converter (ADC) coupled to the digital logic unit and configurable to receive a signal from a RIN detector, and a rate ADC coupled to the digital logic unit and configurable to receive a signal from a rate detector. The mixed signal ASIC also includes a light source digital-to-analog converter (DAC) coupled to the digital logic unit, and a thermo-electric cooler DAC coupled to the digital logic unit, both of which are configurable to send control signals to a light source of the gyroscope. The mixed signal ASIC further includes an integrated optical chip DAC, an eigen-frequency servo DAC, and a heater servo DAC, all of which are coupled to the digital logic unit.

5 Claims, 1 Drawing Sheet

(56) References Cited

U.S. PATENT DOCUMENTS

| | | | | |
|---|---|---|---|---|
| 2006/0075934 A1* | 4/2006 | Ram | ............... | B60N 3/004 |
| | | | | 108/44 |
| 2009/0323741 A1* | 12/2009 | Deladurantaye et al. | ...... | 372/25 |
| 2010/0172383 A1* | 7/2010 | Montalvo et al. | ......... | 372/38.01 |
| 2011/0192226 A1 | 8/2011 | Hayner et al. | | |

FOREIGN PATENT DOCUMENTS

| | | |
|---|---|---|
| EP | 2428767 | 3/2012 |
| WO | 9800682 | 1/1998 |

OTHER PUBLICATIONS

European Patent Office, European Search Report from EP Application 14151827.4 mailed Jun. 1, 2016, from Foreign Counterpart of U.S. Appl. No. 13/755,139, filed Jun. 1, 2016, pp. 1-4, Published in: EP.

European Patent Office, "Communication pursuant to Article 94(3) EPC", from Foreign Counterpart of U.S. Appl. No. 13/755,139, filed Jun. 29, 2016, pp. 1-6, Published in: EP.

* cited by examiner

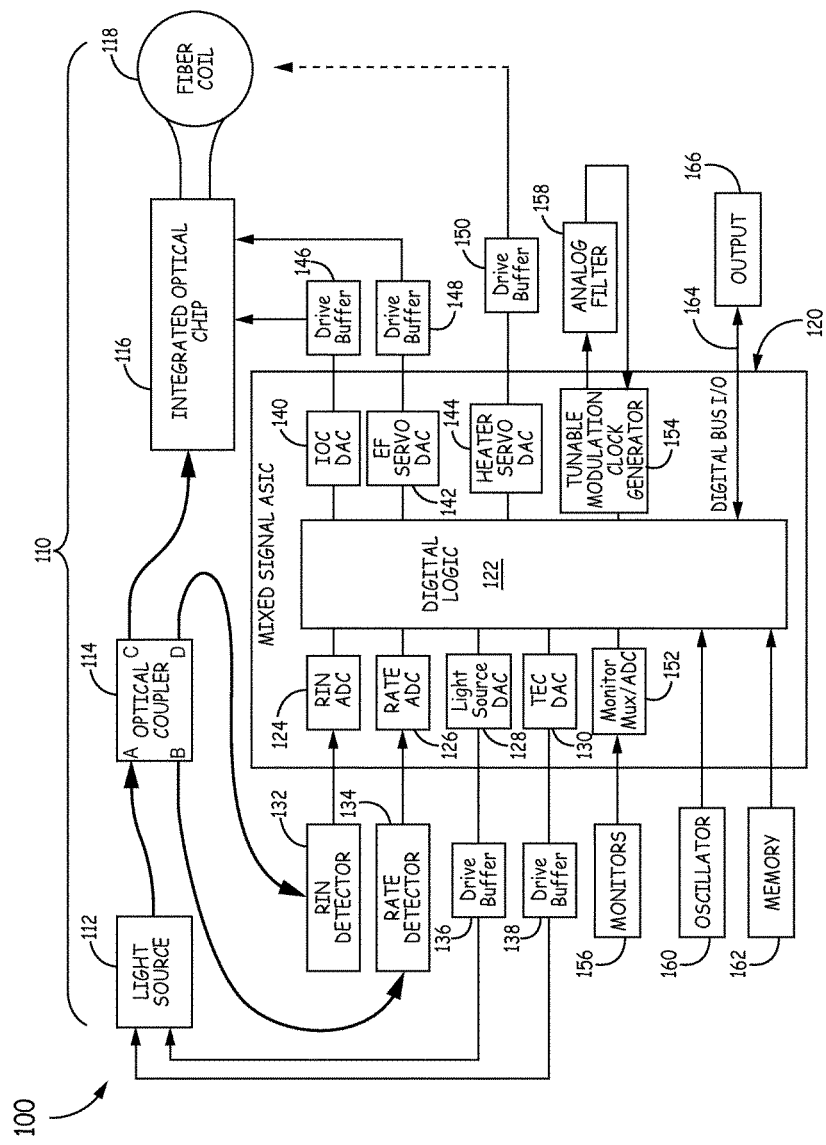

FIBER OPTIC GYROSCOPE MIXED SIGNAL APPLICATION SPECIFIC INTEGRATED CIRCUIT

BACKGROUND

In the manufacture of a Fiber Optic Gyroscope (FOG) product, a unique set of electronics is required for each product. Depending on the FOG product, an electronics solution usually includes two or more Printed Circuit Assemblies (PCAs). One PCA provides the digital electronics required for implementing the gyroscope control algorithms and interfacing to an external host, while the other PCA(s) provide the analog signal conditioning and conversion functions for interfacing to the gyroscope optics components. Each PCA includes a Printed Wiring Board (PWB) that is populated with a large number of discrete components, such as digital circuitry, Analog-to-Digital Converters (ADCs), Digital-to-Analog Converters (DACs), operational amplifiers, transistors, diodes, resistors, capacitors, and the like.

Manufacturing this type of electronics assembly is labor-intensive and expensive, as well as contributes to the occurrence of electronic faults. Installing a large number of discrete components greatly increases the possibility of a worker installing the wrong part, or installing the part backwards. The high number of solder joints required also increases the risk of a having a bad connection. Manufacturing this type of electronics assembly also requires the ordering and stocking of large numbers of different components over the life cycle of a particular FOG product. The possibility of a part becoming obsolete and requiring an expensive redesign of a PCA increases with the number of components involved.

Another problem with current PCA designs is that they are physically large due to the large number of components required. As a result, it is becoming increasingly difficult to fit FOG products into shrinking mechanical design requirements.

SUMMARY

A system comprising a fiber optic gyroscope and a mixed signal application specific integrated circuit (ASIC) connected to the fiber optic gyroscope is provided. The fiber optic gyroscope comprises a light source, an optical coupler in optical communication with the light source, an integrated optical chip in optical communication with the optical coupler, and a fiber optic coil in optical communication with the integrated optical chip. The mixed signal ASIC comprises a digital logic unit; a relative intensity noise (RIN) analog-to-digital converter (ADC) operatively coupled to the digital logic unit and configurable to receive a signal from an external RIN detector in optical communication with the optical coupler; a rate ADC operatively coupled to the digital logic unit and configurable to receive a signal from an external rate detector in optical communication with the optical coupler; a light source digital-to-analog converter (DAC) operatively coupled to the digital logic unit and configurable to send a control signal from the digital logic unit to the light source to control a current of the light source; a thermo-electric cooler DAC operatively coupled to the digital logic unit and configurable to send a control signal from the digital logic unit to the light source to control thermo-electric cooling of the light source; an integrated optical chip DAC operatively coupled to the digital logic unit and configurable to send a control signal from the digital logic unit to the integrated optical chip to modulate the optical signal; an eigen-frequency servo DAC operatively coupled to the digital logic unit and configurable to send a control signal from the digital logic unit to the integrated optical chip to synchronize sampled rate data to a proper eigen-frequency of the fiber optic gyroscope; and a heater servo DAC operatively coupled to the digital logic unit and configurable to send a control signal from the digital logic unit to a heater element.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which:

FIG. 1 is a block diagram of a fiber optic gyroscope system that includes a mixed signal ASIC according to one embodiment.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A fiber optic gyroscope (FOG) mixed signal application specific integrated circuit (ASIC) is provided that is configurable for multiple applications, products, and uses. The FOG mixed signal ASIC provides a unique solution to the assembly, quality, life-cycle, and size concerns of conventional devices by combining digital control functions along with analog conditioning and conversion functions onto a single, highly integrated device, resulting in one component that performs as well or better than multiple Printed Circuit Assemblies (PCAs).

Since different FOG products require different electronic configurations, the mixed signal ASIC includes functions that are common to the different products, and provides functions unique to each product. Various methods can be used to select a unique configuration of the mixed signal ASIC based on individual product requirements. Selection methods include, but are not limited to, Programmable Read Only Memory (PROM) configurations, external pull up/down selection pins, or configuration by external host via a serial bus. For example, the mixed signal ASIC can be configured to work with any individual product via an external PROM or Electrically Erasable PROM (EEPROM), and via the use of configuration pins that can be pulled up or down to select individual functions.

As the mixed signal ASIC is one component that replaces many, the cost of manufacturing a FOG is greatly reduced while quality is enhanced. The mixed signal ASIC can be consistently mass produced to very high quality standards, which provides for increased reliability both during and after manufacture. A mixed signal ASIC package will be many times smaller than even one conventional PCA, which allows for the production of smaller gyroscopes with a reduced electronics footprint.

FIG. 1 illustrates a fiber optic gyroscope system 100 according to one embodiment. The gyroscope system 100 includes an interferometric fiber optic gyroscope (IFOG) 110 operatively connected to a mixed signal ASIC 120. The IFOG 110 includes a light source 112 such as a laser device, an optical coupler 114, an integrated optical chip 116 that includes various optics components, and a fiber coil 118. The light source 112 is in optical communication with integrated optical chip 116 via optical coupler 114, which receives a light beam from light source 112 at an input A and transmits the light beam at an output C to integrated optical chip 116. The light beam is then propagated through fiber coil 118 from integrated optical chip 116.

The mixed signal ASIC 120 includes a digital logic unit 122, which may include one or more microprocessors, operatively coupled to various electronic components. These electronic components include a Relative Intensity Noise (RIN) analog-to-digital converter (ADC) 124, a rate ADC 126, a light source digital-to-analog converter (DAC) 128, a Thermo-Electric Cooler (TEC) DAC 130, an integrated optical chip (IOC) DAC 140, an Eigen-Frequency (EF) servo DAC 142, and a heater servo DAC 144. The mixed signal ASIC 120 can also include additional electronic components that are operatively interfaced to digital logic unit 122, such as a monitor multiplexer (Mux)/ADC 152, and a tunable modulation clock generator 154.

The digital logic unit 122 provides various logical functions and controls, including loop closure logic, master/bias clock logic, monitor logic, TEC control, heater control, memory interface, clocks and resets, serial input/output logic, and the like.

The RIN ADC 124 is configurable to receive a signal from an external RIN detector 132 that is in optical communication with an output D of optical coupler 114. The RIN detector 132 includes a photodetector that converts the optical signal from optical coupler 114 to an analog signal that is sent to RIN ADC 124 through a RIN channel in mixed signal ASIC 120. The RIN ADC 124 sends a digital signal to digital logic unit 122 to provide attenuation of the optical noise in a rate channel provided by rate ADC 126.

The rate ADC 126 is configurable to receive a signal from an external rate detector 134 that is in optical communication with an output B of optical coupler 114. The external rate detector 134 includes a photodetector that converts the optical signal from optical coupler 114 to an analog signal that is sent to rate ADC 126 through the rate channel in mixed signal ASIC 120. The rate ADC 126 sends a digital signal to digital logic unit 122 to provide a signal that is proportional to the rotation rate of fiber coil 118.

The light source DAC 128 is configurable to send a control signal from digital logic unit 122 to light source 112 via a first external drive buffer 136 that is coupled to a first input of light source 112. The control signal from light source DAC 128 can be received by an external pump drive to control the pump current of a laser in light source 112, for example.

The TEC DAC 130 is configurable to send a control signal from digital logic unit 122 to light source 112 via a second external drive buffer 138 that is coupled to a second input of light source 112. The control signal from TEC DAC 130 can be received by an external TEC drive to control thermo-electric cooling of a laser in light source 112, for example.

The IOC DAC 140 is configurable to send a control signal from digital logic unit 122 to integrated optical chip 116 through a third external drive buffer 146 to modulate the optical signal. The control signal from IOC DAC 140 can be received by an external IOC drive to control the optics in integrated optical chip 116.

The EF servo DAC 142 is configurable to send a control signal from digital logic unit 122 to integrated optical chip 116 through a fourth external drive buffer 148 to synchronize sampled rate data to the gyroscope's proper eigen-frequency. For example, the control signal from EF servo DAC 142 can be received by an external EF servo drive to maintain the proper eigen-frequency of the gyroscope. The digital logic unit 122 receives EF data from rate ADC 126 to close the EF loop using the EF servo DAC 142.

The heater servo DAC 144 is configurable to send a control signal from digital logic unit 122 to a heater element of the gyroscope through a fifth external drive buffer 150. The control signal from heater servo DAC 144 can be received by an external heater drive to control the temperature of the heater element. The digital logic unit 122 receives temperature data via the monitor MUX/ADC 152 to close the temperature loop.

The monitor Mux/ADC 152 is configurable to receive signals from one or more external monitors 156 that provide information related to health of the system, including temperatures, currents, spares, and the like. The RIN ADC 124 sends a digital signal to digital logic unit 122 for processing of the system health information. The monitor data can be used to close some of the loops or transmit monitor data to an output 166 via a digital bus input/output (I/O) 164. The digital bus I/O 164 provides signal communication between digital logic unit 122 and output 166.

The tunable modulation clock generator 154 outputs a digitized master/bias modulation signal to an external analog filter 158 such as a low pass filter, which attenuates unwanted spurs. The analog filter 158 outputs a single dominant frequency sine wave that is returned to modulation clock generator 154, which converts the sine wave to a square wave, providing the digital logic unit 122 with a clock signal that is synchronized and proportional to the gyroscope's proper eigen-frequency.

The system 100 also includes an oscillator 160 that provides a system clock signal to digital logic unit 122. An external memory unit 162 such as a non-volatile memory is operatively connected to digital logic unit 122. The memory unit 162 can be provided in the form of multiple memory devices or chips that are "stacked" onto a mixed signal die in order to reduce board space.

The various electronic components in the mixed signal ASIC, as well as the external components that are part of the overall system, can be commercial off the shelf (COTS) components or can be radiation hardened components, depending on where the gyroscope will be implemented.

In other embodiments the mixed signal ASIC can be expanded to control several fiber optic gyroscopes to build a complete navigation system. In addition, the mixed signal ASIC can be configured to interface with different IFOG products.

Example Embodiments

Example 1 includes a system comprising a fiber optic gyroscope that comprises a light source, an optical coupler in optical communication with the light source, an integrated optical chip in optical communication with the optical coupler, and a fiber optic coil in optical communication with the integrated optical chip. The system also comprises a mixed signal application specific integrated circuit (ASIC) operatively connected to the fiber optic gyroscope, the mixed signal ASIC comprising: a digital logic unit; a relative intensity noise (RIN) analog-to-digital converter operatively coupled to the digital logic unit and configurable to receive a signal from an external RIN detector in optical communication with the optical coupler; a rate analog-to-digital converter operatively coupled to the digital logic unit and configurable to receive a signal from an external rate detector in optical communication with the optical coupler; a light source digital-to-analog converter operatively coupled to the digital logic unit and configurable to send a control signal from the digital logic unit to the light source to control a current of the light source; a thermo-electric cooler digital-to-analog converter operatively coupled to the digital logic unit and configurable to send a control signal from the digital logic unit to the light source to control thermo-electric cooling of the light source; an integrated optical chip digital-to-analog converter operatively coupled to the digital logic unit and configurable to send a control signal from the digital logic unit to the integrated optical chip to modulate the optical signal; an eigen-frequency servo digital-to-analog converter operatively coupled to the digital logic unit and configurable to send a control signal from the digital logic unit to the integrated optical chip to synchronize sampled rate data to a proper eigen-frequency of the fiber optic gyroscope; and a heater servo digital-to-analog converter operatively coupled to the digital logic unit and configurable to send a control signal from the digital logic unit to a heater element.

Example 2 includes the system of Example 1, wherein the fiber optic gyroscope comprises an interferometric fiber optic gyroscope.

Example 3 includes the system of any of Examples 1-2, wherein the light source comprises a laser device.

Example 4 includes the system of any of Examples 1-3, wherein the mixed signal ASIC further comprises: a monitor multiplexer and analog-to-digital converter operatively coupled to the digital logic unit and configured to receive a signal from one or more external monitors.

Example 5 includes the system of any of Examples 1-4, further comprising an oscillator that provides a system clock signal to the digital logic unit.

Example 6 includes the system of any of Examples 1-5, further comprising a memory unit operatively connected to the digital logic unit.

Example 7 includes the system of Example 6, wherein the memory unit includes one or more non-volatile memory devices.

Example 8 includes the system of any of Examples 1-7, wherein the light source digital-to-analog converter sends a control signal to the light source via a first drive buffer.

Example 9 includes the system of any of Examples 1-8, wherein the thermo-electric cooling digital-to-analog converter sends a control signal to the light source via a second drive buffer.

Example 10 includes the system of any of Examples 1-9, wherein the integrated optical chip digital-to-analog converter sends a control signal to the integrated optical chip via a third drive buffer.

Example 11 includes the system of any of Examples 1-10, wherein the eigen-frequency servo digital-to-analog converter sends a control signal to the integrated optical chip via a fourth drive buffer.

Example 12 includes the system of any of Examples 1-11, wherein the heater servo digital-to-analog converter sends a control signal to the heater element via a fifth drive buffer.

Example 13 includes the system of any of Examples 1-12, wherein the mixed signal ASIC further comprises a tunable modulation clock generator that outputs a modulation clock signal to an external analog filter, wherein the analog filter outputs a single dominant frequency sine wave that is returned to the tunable modulation clock generator.

Example 14 includes the system of Example 13, wherein the analog filter comprises a low pass filter.

Example 15 includes the system of any of Examples 1-14, further comprising a digital bus input/output that provides signal communication between the digital logic unit and an output.

Example 16 includes a mixed signal ASIC configured for connection to a fiber optic gyroscope, the mixed signal ASIC comprising a digital logic unit; a RIN analog-to-digital converter operatively coupled to the digital logic unit and configurable to receive a signal from an external RIN detector in optical communication with an optical coupler of the fiber optic gyroscope; a rate analog-to-digital converter operatively coupled to the digital logic unit and configurable to receive a signal from an external rate detector in optical communication with the optical coupler; a light source digital-to-analog converter operatively coupled to the digital logic unit and configurable to send a control signal from the digital logic unit to a light source of the fiber optic gyroscope to control a current of the light source; a thermo-electric cooler digital-to-analog converter operatively coupled to the digital logic unit and configurable to send a control signal from the digital logic unit to the light source to control thermo-electric cooling of the light source; an integrated optical chip digital-to-analog converter operatively coupled to the digital logic unit and configurable to send a control signal from the digital logic unit to an integrated optical chip of the fiber optic gyroscope to modulate an optical signal; an eigen-frequency servo digital-to-analog converter operatively coupled to the digital logic unit and configurable to send a control signal from the digital logic unit to the integrated optical chip to synchronize sampled rate data to a proper eigen-frequency of the fiber optic gyroscope; a heater servo digital-to-analog converter operatively coupled to the digital logic unit and configurable to send a control signal from the digital logic unit to a heater element of the fiber optic gyroscope; a monitor multiplexer and analog-to-digital converter operatively coupled to the digital logic unit and configurable to receive a signal from one or more external monitors; a tunable modulation clock generator that outputs a modulation clock signal to an external analog filter, wherein the external analog filter outputs a single dominant frequency sine wave that is returned to the tunable modulation clock generator; and a digital bus input/output that provides signal communication between the digital logic unit and an output.

Example 17 includes the mixed signal ASIC of Example 16, wherein the mixed signal ASIC is operatively connected to an interferometric fiber optic gyroscope.

Example 18 includes the mixed signal ASIC of any of Examples 16-17, wherein the digital logic unit receives a clock signal from an external oscillator.

Example 19 includes the mixed signal ASIC of any of Examples 16-18, wherein the digital logic unit is operatively connected to an external memory unit comprising one or more non-volatile memory devices.

Example 20 includes the mixed signal ASIC of any of Examples 16-19, wherein the external analog filter comprises a low pass filter.

The present invention may be embodied in other forms without departing from its essential characteristics. The described embodiments are to be considered in all respects only as illustrative and not restrictive. Therefore, it is intended that this invention be limited only by the claims and the equivalents thereof.

What is claimed is:
1. A mixed signal application specific integrated circuit (ASIC), the mixed signal ASIC comprising:

a single printed circuit assembly configured for connection to a fiber optic gyroscope;

a digital logic unit on the printed circuit assembly, wherein the digital logic unit implements modulation and compensation algorithms for one or more servo loops, and provides configuration, control, and communication services;

a relative intensity noise (RIN) analog-to-digital converter on the printed circuit assembly, the RIN analog-to-digital converter operatively coupled to the digital logic unit, wherein the RIN analog-to-digital converter is operatively coupled to an external RIN detector in optical communication with an optical coupler of the fiber optic gyroscope;

a rate analog-to-digital converter on the printed circuit assembly, the rate analog-to-digital converter operatively coupled to the digital logic unit and configurable to receive a signal from an external rate detector in optical communication with the optical coupler;

a light source digital-to-analog converter on the printed circuit assembly, the light source digital-to-analog converter operatively coupled to the digital logic unit and configurable to send a control signal from the digital logic unit to a light source of the fiber optic gyroscope to control a current of the light source;

a thermo-electric cooler digital-to-analog converter on the printed circuit assembly, the thermo-electric cooler digital-to-analog converter operatively coupled to the digital logic unit and configurable to send a control signal from the digital logic unit to the light source to control thermo-electric cooling of the light source;

an integrated optical chip digital-to-analog converter on the printed circuit assembly, the integrated optical chip digital-to-analog converter operatively coupled to the digital logic unit and configurable to send a control signal from the digital logic unit to an integrated optical chip of the fiber optic gyroscope to modulate an optical signal;

an eigen-frequency servo digital-to-analog converter on the printed circuit assembly, the eigen-frequency servo digital-to-analog converter operatively coupled to the digital logic unit and configurable to send a control signal from the digital logic unit to the integrated optical chip to synchronize sampled rate data to a proper eigen-frequency of the fiber optic gyroscope;

a heater servo digital-to-analog converter on the printed circuit assembly, the heater servo digital-to-analog converter operatively coupled to the digital logic unit and configurable to send a control signal from the digital logic unit to a heater element of the fiber optic gyroscope;

a monitor multiplexer and analog-to-digital converter on the printed circuit assembly, the monitor multiplexer and analog-to-digital converter operatively coupled to the digital logic unit and configurable to receive a signal from one or more external monitors;

a digital-to-analog converter on the printed circuit assembly and operatively coupled to the digital logic unit to form a direct digital synthesizer that outputs a tunable modulation clock signal to an external analog filter, wherein the external analog filter outputs a single dominant frequency sine wave that is returned to an analog comparator on the printed circuit assembly to generate a bias modulation clock; and a digital serial input/output on the printed circuit assembly that provides signal communication between the digital logic unit and a host;

wherein the mixed signal ASIC provides all electronic functions associated with operation of the fiber optic gyroscope on a single integrated device.

2. The mixed signal ASIC of claim 1, wherein the mixed signal ASIC is configured for connection to an interferometric fiber optic gyroscope.

3. The mixed signal ASIC of claim 1, wherein the digital logic unit is configured to receive a clock signal from an external oscillator.

4. The mixed signal ASIC of claim 1, wherein the digital logic unit is configured for connection to an external memory unit comprising one or more non-volatile memory devices.

5. The mixed signal ASIC of claim 1, wherein the external analog filter comprises a low pass filter.

* * * * *